United States Patent
Sah

(10) Patent No.: US 6,297,161 B1
(45) Date of Patent: Oct. 2, 2001

(54) METHOD FOR FORMING TFT ARRAY BUS

(75) Inventor: Wen-Jyh Sah, Tainan (TW)

(73) Assignee: Chi Mei Optoelectronics Corp. (TW)

(*) Notice: Subject to any disclaimer, the term of this patent is extended or adjusted under 35 U.S.C. 154(b) by 0 days.

(21) Appl. No.: 09/351,256

(22) Filed: Jul. 12, 1999

(51) Int. Cl.$^7$ .................................................. H01L 21/302
(52) U.S. Cl. .......................... 438/706; 438/720; 438/722
(58) Field of Search .................................. 438/149, 151, 438/159, 161, 163, 160, 166, 234, 235, 236, 312, 334, 706, 720, 722; 257/327, 57, 58

(56) References Cited

U.S. PATENT DOCUMENTS

| | | | |
|---|---|---|---|
| 5,156,986 | * 10/1992 | Wei et al. | 437/40 |
| 5,763,904 | * 2/1999 | Nakajima et al. | 257/66 |
| 5,831,281 | * 11/1998 | Kurogane et al. | 257/57 |
| 5,872,021 | * 2/1999 | Matsumoto et al. | 438/159 |
| 5,946,547 | * 8/1999 | Kim et al. | 438/149 |
| 6,043,859 | * 3/2000 | Maeda | 257/761 |

* cited by examiner

Primary Examiner—Robert Kunemund
Assistant Examiner—Duy-Vu Deo

(57) ABSTRACT

A method for fabricating source/drain and gate of a TFT (thin film transistor) array is disclosed herein. After depositing multi-layer structures according to the present invention, an etching process is performed to define source/drain or gate of a TFT array and an excellent taper profile is easily obtained even though only the prior art etchant is used. The method for depositing multi-layer structures includes the following steps. Firstly, form a major conductive metallic layer on the substrate or on the previous layers depending on whether gate or source/drain bus is to be formed, then form a barrier layer on the metallic layer with dopant doped into the barrier layer. It is noted that the concentration of the dopant has a gradient distribution, and has a maximum value at the edge of the barrier layer adjacent to the metallic layer. The first edge of the barrier layer adjacent to the metallic layer has a first dopant concentration, and the second edge of the barrier layer farther from the metallic layer has a second dopant concentration. The first dopant concentration is greater than the second dopant concentration. A special feature of this structure is that the wet etching rate of the doped barrier layer can be modulated by the doping concentration. Specifically, the higher the doping concentration, the lower the etching rate is preferred. Because the etching rate of the barrier layer is gradient changed by modulating the doping concentration during film deposition, the taper profile of the barrier layer will be automatically formed without the adjustment of the adhesion to the resist mask. It makes the etching chemistry less complicated and the profile is not sensitive to the bath life. Another feature of this method is that the etching rate of the barrier layer should be higher than the major metallic conductive layer to avoid the negative slope of the profile.

6 Claims, 5 Drawing Sheets

METHOD FOR FORMING TFT ARRAY BUS

BACKGROUND OF THE INVENTION

1. Field of the Invention

This invention relates to a method for fabricating array bus by using taper etching, and more particularly, to a method for fabricating TFT (Thin-Film Transistor) array bus by using taper etching.

2. Description of the Prior Art

Unlike the case in the IC industry, there were so many metal materials been used in the development history of TFT process. However, the trend for larger size and higher resolution makes it inevitable to use the Aluminum as the major conducting material for the transmission bus of the TFT array due to its low resistivity. When using aluminum as the bus material, usually a multi-layer metal structure is used because of the poor contact property between Aluminum and other materials. For example, the Ti/Al/Ti structure was proposed for the source/drain bus in the top ITO TFT array process. In the previous structure, the Ti acts as the barrier layer. The bottom Ti serves as the barrier between Al and the underlying N+ layer to improve the ohmic contact property, whereas the top Ti is to improve the contact between Al and the ITO. In addition to the Ti/Al/Ti structure, other material combinations were also proposed for the Al based transmission bus. The common feature is that multi-layer structure with barrier layer must be used.

Although the poor contact property of Al can be solved by the application of the barrier layer, the multi-layer structure raise new process issues, especially in the etching process. Basically, metal etching can be performed by either dry etching or wet etching. For example, Ti/Al/Ti is usually etched by dry etching. The advantage of the dry etching is easier for profile control. The profile control is extremely important in the TFT process. Since the planarization technology is not mature in the TFT process yet, the taper profile of each layer is required to prevent the bad step coverage of the following layers. Although dry etching is a good method for profile control, the selectivity to the underlying Si layer raise another concern. Moreover, the equipment maintenance is a hard job. The alternative is wet etching. The wet etching method has the advantage of lower equipment cost and also much better selectivity to the underlying Si layer. Unfortunately, profile control is more difficult. Generally speaking, in wet etching, two factors must be controlled very well in order to have a good taper profile. The first is a special chemistry to deteriorate the adhesion between the resist mask and the protected material. For example, HNO3 is a well-known agent to achieve this purpose. The second factor is that a good match must be found between the etching chemical and the component material of the multi-layer structure. In other words, the etching rate of the barrier layer and the main conducting layer must be very similar for the same etching chemical. For example, Mo and Al can be etched by the same etching chemical with similar rates. On the contrary, Ti and Al can not be etched with similar rate by a certain chemical. However, a major drawback of the wet etching method for the multi-layer structure is that the match of the rate for different material will drift with the bath life. Moreover, the necessity to add the HNO3 to improve the taper profile will make the situation even more complicated. The above mentioned issues make it not so practical to wet etch the Mo/Al multi-layer structure in spite of the good match of these two material in the same Al etchant.

SUMMARY OF THE INVENTION

Due to above-mentioned issues, it is difficult to etch the multi-layer structured transmission bus in TFT array by wet etching in a very straightforward way. The present invention proposes a simple and practical method to fabricate the multi-layer structured transmission bus in TFT array by using wet etching method. By this method, the taper profile is easier to control in spite of the bath life changes.

The method according to one preferred embodiment of the present invention includes the following steps. Firstly, form a major conductive metallic layer on the substrate or on the previous layers depending on whether gate or source/drain bus is to be formed, then form a barrier layer on the metallic layer with dopant doped into the barrier layer. It is noted that the concentration of the dopant has a gradient distribution, and has a maximum value at the edge of the barrier layer adjacent to the metallic layer. The first edge of the barrier layer adjacent to the metallic layer has a first dopant concentration, and the second edge of the barrier layer farther from the metallic layer has a second dopant concentration. The first dopant concentration is greater than the second dopant concentration. A special feature of this structure is that the wet etching rate of the doped barrier layer can be modulated by the doping concentration. Specifically, the higher the doping concentration, the lower the etching rate is preferred. Because the etching rate of the barrier layer is gradient changed by modulating the doping concentration during film deposition, the taper profile of the barrier layer will be automatically formed without the adjustment of the adhesion to the resist mask. It makes the etching chemistry less complicated and the profile is not sensitive to the bath life. Another feature of this method is that the etching rate of the barrier should be higher than the major metallic conductive layer to avoid the negative slope of the profile.

The method according to another preferred embodiment of the present invention includes the following steps. Firstly, form a major conductive metallic layer on the substrate or on the previous layers depending on whether gate or source/drain bus is to be formed, then form a barrier layer on the metallic layer with dopant doped into the barrier layer. On the doped barrier layer, form one more undoped sacrificial layer with the base material the same as the barrier layer. Because the undoped sacrificial layer has a higher etching rate than the doped layer, the adhesion to the resist mask becomes not so important. This makes the etching chemistry less complicated and thus easier to control.

The transmission bus formed by the said method is electrically coupled to a plurality of transistors of a TFT array. In addition, the plurality of transistors of the TFT array controls the transmittance of the associated LCD cells. The major conductive metallic layer used in the present invention can be made of Al or aluminum alloy such as AlNd. The barrier layer mentioned above can be Mo based material and the dopant can be Nitrogen.

BRIEF DESCRIPTION OF THE DRAWINGS

The above features of the present invention will be more clearly understood from consideration of the following descriptions in connection with accompanying drawings in which.

DESCRIPTION OF THE PREFERRED EMBODIMENT

In fabricating TFT (Thin Film Transistor) LCD (liquid crystal display), it is very important to implement taper profile while an etching step is performed to pattern multi-layer conductive structure to form source/drain of a TFT and source/drain bus of a TFT array. The present invention proposes a method for forming TFT array bus and source/drain with excellent taper etching profile even though only the prior art etchant is used and accordingly raise the yield in fabricating TFT.

The structure and method proposed by the present invention can be used in fabricating semiconductor devices, more particularly in fabricating elements of TFT LCD. In fabricating a LCD (Liquid Crystal Display), a transparent substrate is provided as the base on which pixel electrodes, each with at leat one TFT as a switching element, and other elements are formed. Every pixel electrode, electrically coupling to source/drain of associated thin film transistor, is used to control the orientation of the molecule of the liquid crystal. In other word, the pass/obstruction to the light of every LCD cell is controlled by the TFT within a LCD cell. Because a LCD is composed of many LCD cells, in order to control TFT in every LCD cell, the source/drain electrode and gate electrode of every TFT are connected to the source/drain bus and gate bus respectively to form a matrix arrangement. The signal which controls the liquid crystal is fed into the pixel electrode via said source/drain bus.

Figure 1:
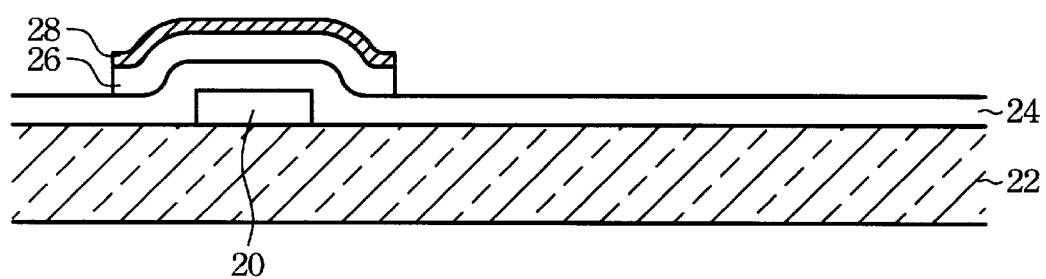
FIG. 1 illustrates a process for forming a TFT, wherein the amorphous silicon layer and doped amorphous silicon layer are formed and patterned on the first insulating layer.
Figure 2:
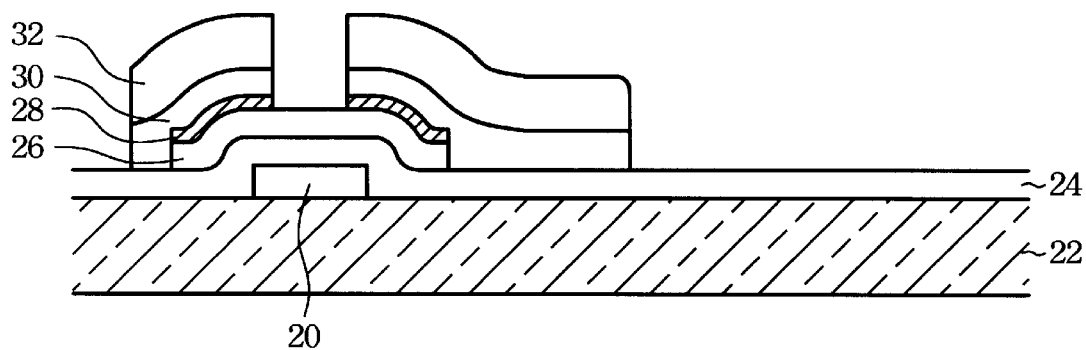
FIG. 2 illustrates a process for forming a TFT, wherein the source and drain of the thin film transistor (TFT) is formed and patterned on the amorphous silicon layer and doped amorphous silicon layer.

Beginning with how a TFT is formed on said transparent substrate, please refer to FIG. 2. A first conductive layer 20, such as aluminum layer, is formed and patterned on said first substrate 22 to serve as gate electrodes and gate bus. Then, a first insulating layer 24 is formed on said first conductive layer 20 and exposed said first substrate 22. The next step is to form and pattern a first silicon layer 26 and a first doped silicon layer 28 on said first insulating layer 24. The following step is to form the source/drain of a TFT within a LCD cell. Basically, the method utilized to form source/drain according to the present invention can also be applied to form the gate structure. To make the description below more comprehensive, in the following description, we only take the source/drain bus as an example to illustrate how the taper etching process can be performed, and to illustrate the structure of the source/drain bus formed by the method according to the present invention.

Figure 3:
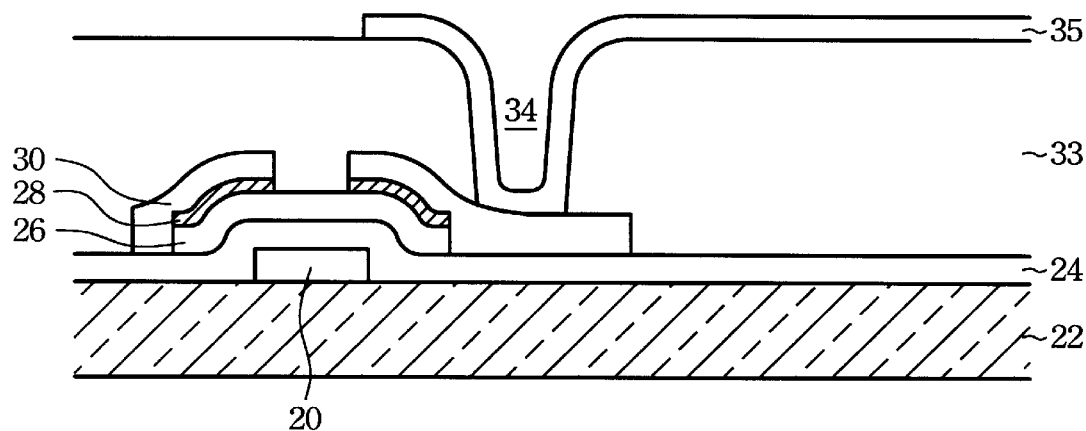
FIG. 3 illustrates a process for forming a TFT, wherein the display electrodes are formed in connection with the source/drain of the TFT.

Referring to FIG. 3, after said silicon layer 26 and said doped silicon layer 28 patterned, a second conductive layer 30 is formed and patterned on said first doped silicon layer 28 (and on said first insulating layer 24) Said first silicon layer 26 can be made of silicon materials such as amorphous silicon. Said first doped silicon layer 28 can be made of doped amorphous silicon.

Figure 4:
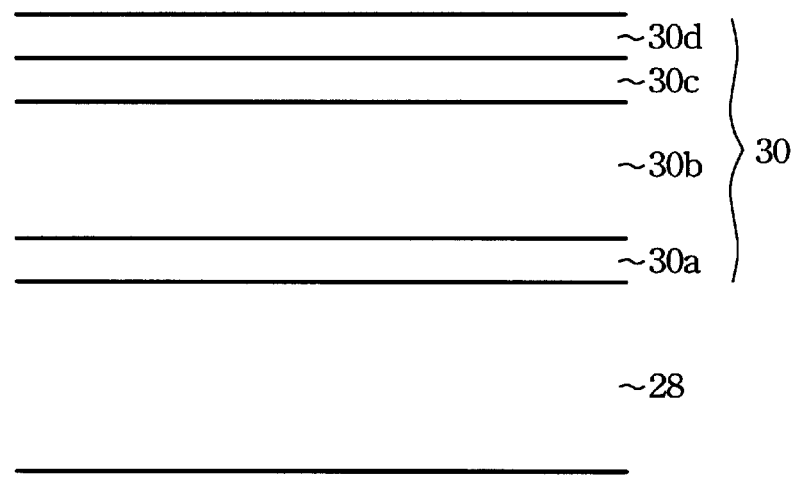
FIG. 4 illustrates the structure according to the first preferred embodiment of the present invention, wherein a sacrificial layer is formed on the top of the multi-layer conductive structure used to form source/drain of a TFT.

When patterning said second conductive layer 30, firstly, a photoresist pattern 32 is formed and developed on the second conductive layer 30. Then, by using said photoresist pattern 32 as a mask, an etching step is performed to etch said second conductive layer 30. The next step is to use the same resist mask to etch away exposed doped silicon layer 28 to form the channel of the TFT. Referring to FIG. 4, the next step is to remove said photoresist pattern 32, and then to form a second insulating layer 33 on said first insulating layer 24, said first silicon layer 26, and said second conductive layer 30. Then, an etching step is performed to etch said second insulating layer 33 to form a contact hole 34 to expose a portion of said second conductive layer 30. Subsequently, a third conductive layer 35 is formed on said second insulating layer 33 and the portion of exposed second conductive layer 30. Next, an etching step is performed to pattern said third conductive layer 35 as a pixel electrode. It is noted that said first conductive layer 20 constitutes the gate of the TFT, said second conductive layer 30 composes the source/drain of the TFT, and said third conductive layer 35 electrically coupling to said second conductive layer 30 constitutes the display electrode of the LCD cell.

Turning to FIG. 3, while etching said second conductive layer to form the source/drain of the TFT array, it is important to form a taper profile. The present invention is characterized by providing a method to form source/drain (or gate) of a TFT array with taper profile simply by using just well-known etching agent in prior arts. FIG. 4, illustrates the first preferred embodiment of the present invention to form said second conductive layer 30 as source/drain. Firstly, a first barrier layer 30a is formed on said doped silicon layer 28 (and said first insulating layer 24). Then a metallic layer 30b is formed on said first barrier layer 30a. Subsequently, a second barrier layer 30c is formed on said metallic layer 30b, and a sacrificial layer 30d is formed on said second barrier layer 30c. Accordingly, a multi-layer conductive structure is deposited.

Figure 5:
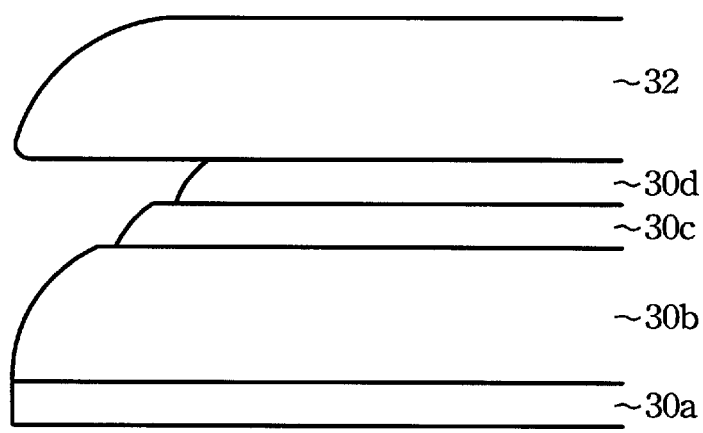
FIG. 5 illustrates the structure formed by a taper etching process according to the first preferred embodiment of the present invention, wherein the sacrificial layer is etched most to form a taper profile.
Figure 6:
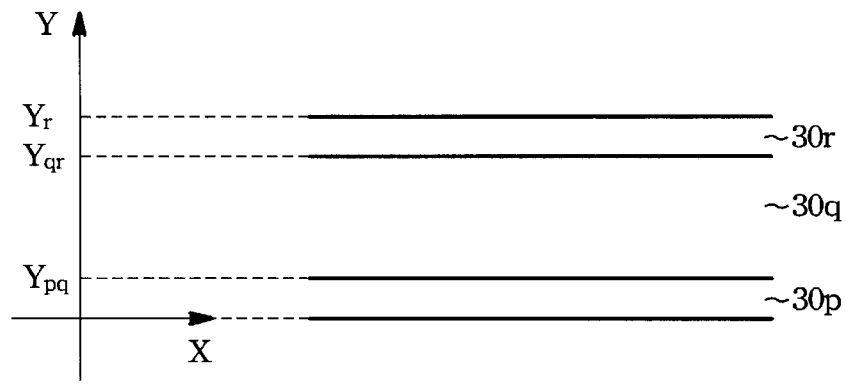
FIG. 6 illustrates the structure according to the second preferred embodiment of the present invention, wherein a x-y coordinate shows the thickness of every layer of the multi-layer conductive structure.

According to the first preferred embodiment, the thickness of said sacrificial layer 30d can be less than 1000 angstroms, typically, less than 500 angstroms. Said first barrier layer 30a is made of MoN or CrN, said metallic layer 30b made of metal aluminum, and said second barrier layer 30c made of MoN or CrN. Said sacrificial layer 30d can be made of any conductive material with relatively higher etching rate while an etching step is performed to pattern said second barrier layer 30c, For example, said sacrificial layer 30d can be made of Mo while MoN is chosen for said second barrier layer 30c. Besides, said sacrificial layer 30d reduces the adherence of said second barrier layer 30c to the photoresist pattern 32. Referring to FIG. 5, while etching said multi-layer conductive structure to form the source/drain of the TFT array, the sacrificial layer 30d shrinks faster than the second barrier layer 30c does.

It is noted that the etching process used to form the source/drain can implement taper etching without additional chemistry.

In the second preferred embodiment of the present invention, the following steps can be used to form said second conductive layer 30. Firstly, referring to FIG. 8, a first barrier layer 30p is formed on the first doped silicon layer 28 (and said first insulating layer 24), Then a metallic layer 30q is formed on said first barrier layer 30p. Subsequently, a second barrier layer 30r is formed on the metallic layer 30q. Said first barrier layer 30p can be made of MoN, TiN, or CrN, said metallic layer 30q made of metal aluminum (Al) or aluminum alloy, such as AlNd. In addition, said second barrier layer 30r can be made of MoN, TiN, or CrN. The etching rate to the MoN, while using the conventional etching chemistry, decreases as concentration of nitrogen atoms within the MoN increases.

In fabricating said second barrier layer 30r, nitrogen is added to the carrier gas that is used to sputter depositing the second barrier layer 30r. Besides, the concentration of the added nitrogen gas is adjusted so as to make the distribution of the nitrogen atom in said second barrier layer 30r decrease gradually. In other words, the adjustment of the concentration of the added nitrogen gas enables the concentration of the nitrogen atom in said second barrier layer 30r to decrease gradually from the interface between said metallic layer 30q and said second barrier layer 30r along the direction departing from the interface mentioned above.

Figure 7:
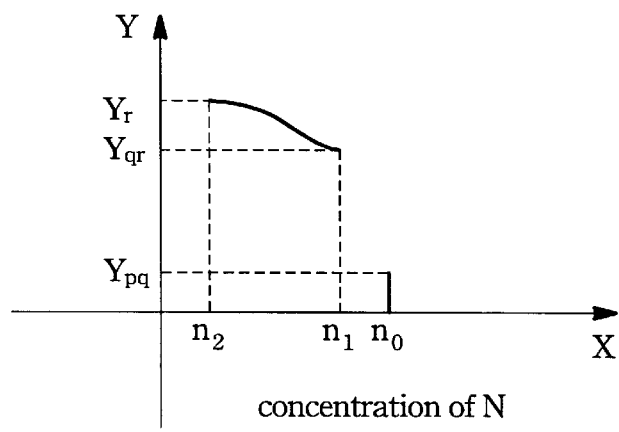
FIG. 7 illustrates the dopant concentration distribution in the multi-layer conductive structure with respect to the thickness according to the second preferred embodiment of the present invention.

While fabricating the first barrier layer 30p, the nitrogen gas added to the carrier gas remains at a constant flow rate such that the nitrogen concentration remains at a constant value equal to or higher than the maximum of said second barrier layer 30r. Assume the bottom of said first barrier layer 30p as the original point (y=0) of the y axis, and a first interface between said first barrier layer 30p and said metallic layer 30q as the point y=$y_{pq}$. Besides, assume a second interface between said second barrier layer 30r and said metallic layer 30q as the point y=$y_{qr}$, and the top of said second barrier layer 30r as $y_r$. The concentration distribution of the nitrogen atom in said second barrier layer 30r is illustrated in FIG. 7. The concentration of the nitrogen atom has its maximum value $n_0$ at the original point of y-axis, and has its minimum value $n_2$ at the point $y_r$, the top of said second barrier layer 30r. $n_2$ can be zero anyway.

Figure 8:
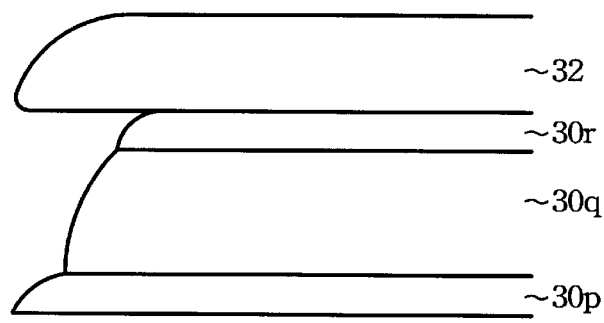
FIG. 8 illustrates the structure of a source/drain bus formed by a taper etching process according to the second preferred embodiment of the present invention, wherein the side of top layer 30r is not uniformly etched due to the dopant (nitrogen) concentration variation.
Figure 9:
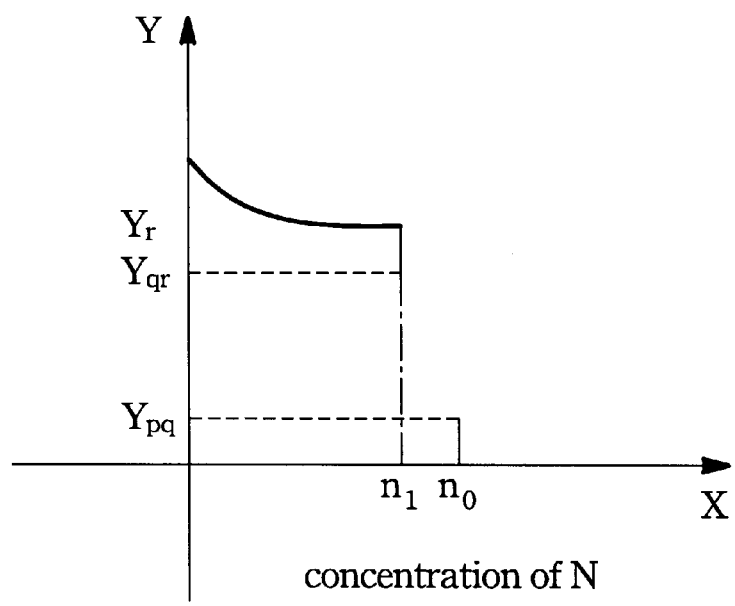
FIG. 9 illustrates the dopant concentration distrubution in the multi-layer conductive structure with respect to the thickness according to the third preferred embodiment of the present invention.

Referring to FIG. 8, while etching said second conductive layer 30, the etching rate of the chemistry to said second barrier layer 30r is maximum compared with that to said first barrier layer 30p and said metallic layer 30q. In addition, due to the gradient distribution of the nitrogen atom concentration within said second barrier layer 30r as shown in FIG. 9,. the portion of said second barrier layer 30r adjacent to the photoresist 32 is etched faster than that adjacent to said metallic layer 30q. It is obvious that, when the source/drain is fabricated according to the second preferred embodiment of the present invention, the taper etching process can be performed without additional chemistry. The taper profile can be obtained by using the prior art chemistry used to etch said second conductive layer 30.

Figure 10:
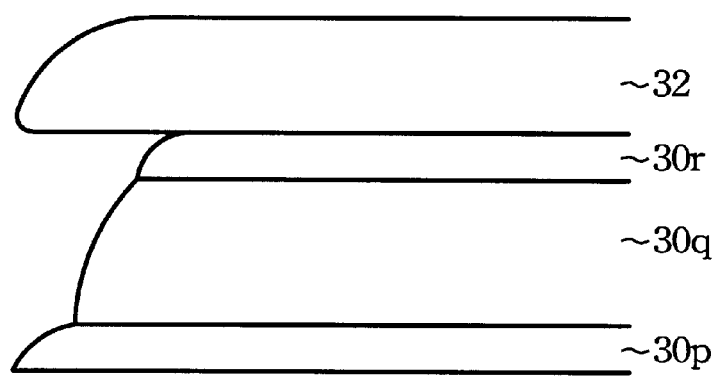
FIG. 10 illustrates the structure of a source/drain bus formed a taper etching process according to the third preferred embodiment of the present invention etched by, wherein the side of the top layer 30w is not uniformly etched due to the dopant concentration variation.

To get a gradient nitrogen doping profile in said second barrier layer 30r, the third preferred embodiment of the present invention utilizes the following steps to control the nitrogen gas. While depositing said second barrier layer 30r, the flow rate of the nitrogen gas remains at a constant for a period of time, then stop the supply of nitrogen gas with the deposition going on. The nitrogen gas in the chamber will be consumed till the chamber runs out of the nitrogen gas. The concentration of the nitrogen atom in said second barrier layer 30r is a gradient distribution as shown in FIG. 9, which makes the taper etching process easily implemented while forming source/drain. FIG. 10 illustrates the result after the taper etching is performed.

Though the preferred embodiments of the present invention utilize the method for fabricating the source/drain of TFT array as an example to illustrate process details, the methods proposed can be applied in fabricating the gate of the TFT array simply sparing the fabrication of the said barrier layer under the metallic layer of said second conductive layer 30.

As will be understood by persons skilled in the art, the foregoing preferred embodiments of the present invention are illustrative of the present invention rather than limiting the present invention. Having described the invention in connection with a preferred embodiment, for example, if the various etchant is used in the preferred embodiments, as long as the method for fabricating bus material is essentially the same as that disclosed herein, the modification will now suggest itself to those skilled in the art. While the preferred embodiments of the invention have been illustrated and described, it will be appreciated that various changes can be made therein without departing from the spirit and scope of the invention.

What is claimed is:

1. A method for forming two-layer gate structure with taper etching profile, wherein said gate structure is formed on an TFT array substrate of a TFT-LCD device, comprises the steps of:

forming a metallic layer on said TFT array substrate;

forming a barrier layer on said metallic layer with dopant doped into said barrier layer, concentration of said dopant within said barrier layer decreasing gradually from the interface between said barrier layer and said metallic layer to the top of said barrier layer, and etching said barrier layer and said metallic layer to define said gate structure.

2. The method as claim 1, wherein said barrier layer is selected from the group consisting of Mo and Cr, said dopant is Nitrogen, and said metallic layer is selected from the group consisting of Al and aluminum alloy.

3. A method for forming triple-layer source/drain structure with taper etching profile, wherein said source/drain structure is formed on an TFT array substrate of a TFT-LCD device, comprises the steps of:

forming and defining a gate, a gate insulating layer, a silicon layer, and a doped silicon subsequently on said TFT array substrate;

forming a first barrier layer on said doped silicon layer and said gate insulating layer;

forming a metallic layer on said first barrier layer;

forming a second barrier layer on said metallic layer with dopant doped into said second barrier layer, concentration of said dopant within said second barrier layer decreasing gradually from the interface between said second barrier layer and said metallic layer to the top of said second barrier layer; and etching said second barrier layer, said metallic layer, and said first barrier layer to define said source/drain structure.

4. The method as claim 3, wherein said second barrier layer is selected from a group consisting of Mo and Cr, said dopant is Nitrogen, said metallic layer selected from the group consisting of Al and aluminum alloy, and said first barrier layer selected from the group consisting of MoN and CrN.

5. The method as claim 4, wherein concentration of Nitrogen within said first barrier layer is higher than that at the bottom of said second barrier layer.

6. The method as claim 4, wherein concentration of Nitrogen within said first barrier layer is equal to that at the bottom of said second barrier layer.

* * * * *